United States Patent [19]

Molinaro

[11] Patent Number: 5,082,518

[45] Date of Patent: Jan. 21, 1992

[54] SPARGER PLATE FOR OZONE GAS DIFFUSION

[75] Inventor: James S. Molinaro, Coplay, Pa.

[73] Assignee: SubMicron Systems, Inc., Allentown, Pa.

[21] Appl. No.: 604,510

[22] Filed: Oct. 29, 1990

[51] Int. Cl.⁵ ..................... B44C 1/22; H01L 21/306; B08B 5/00
[52] U.S. Cl. .................... 156/345; 156/646; 134/31; 134/102
[58] Field of Search ................. 156/646, 345; 134/31, 134/34, 102; 252/79.1

[56] References Cited

U.S. PATENT DOCUMENTS 4,341,592 7/1982 Shortes et al. .................. 156/643
4,491,496 1/1985 Laporte et al. .................. 156/345

Primary Examiner—William A. Powell
Attorney, Agent, or Firm—Hugh D. Jaeger

[57] ABSTRACT

A gas diffusion system for evenly distributing injected gas in a bath including a diffusion sparger plate for spreading and distributing the gas. Gas moves horizontally under the plate, and is relayed upward through a set of gas passages in the plate.

7 Claims, 2 Drawing Sheets

SPARGER PLATE FOR OZONE GAS DIFFUSION

BACKGROUND OF THE INVENTION

1. Field of the Invention

The present invention relates to baths for cleaning semiconductor wafers, and more particularly, relates to an apparatus for evenly distributing a gas throughout such a bath.

2. Description of the Prior Art

In the electronics industry, particularly in the manufacture of semiconductor wafers, baths are commonly used for cleaning semiconductor wafers.

One such example is the cleaning of semiconductor wafers in a sulfuric acid ($H_2SO_4$) bath. In such baths, ozone gas ($O_3$) is ejected into the bath for purposes of oxygenating the acid and extending the useful life of the acid. The byproduct of injection of the ozone into the acid is oxygen. Ozone is used in place of $H_2O_2$ (hydrogen peroxide). The by product of $H_2O_2$ in sulfuric is water. Therefore, ozone is used because it does not create water molecules like $H_2O_2$.

In such a wet chemistry station which uses ozone, an uneven distribution of the gas through the bath will produce uneven results. That is, parts in various locations of the tank will be treated in differing manners, yielding uncertain results.

Attempts have been made to inject ozone in various locations into the tank. What is needed is a diffusion scheme to evenly disburse the gas so that all locations of the bath are evenly oxygenated.

The present invention provides for even distribution of ozone through a sparger plate in a sulfuric bath.

SUMMARY OF THE INVENTION

The general purpose of the present invention involves a liquid-containing tank for bathing parts, the tank having a bottom and multiple sides. The tank includes a gas-conducting pipe mounted generally adjacent to the bottom of the tank having holes for releasing gas into the bath. A sparger plate is mounted in the tank, generally over the pipe, the plate having diffusion holes for distributing gas from the pipe, generally evenly throughout the liquid in the tank.

In one embodiment of the present invention, the tank is made of quartz, PFA, or Teflon, and contains an acid bath, such as sulfuric acid. Ozone gas is injected through a manifold, having multiple pipes with upward facing holes. Gas escapes upward into the bath holes of the pipes. The diffusion means mounted over the pipe is a flat plate sized to lower the bottom of the tank having appropriately sized holes for evenly spreading and distributing the gas bubbles throughout the acid bath.

Since distribution of gas by pipes alone has shown not to evenly distribute oxygen throughout an acid bath, this invention has as one object means for providing even distribution of the ozone.

One object of the present invention is to provide an apparatus which is chemically resistant to the environment in which it must operate, and yet has material integrity. Structure is also provided for cushioning the apparatus to prevent breakage in the tank.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
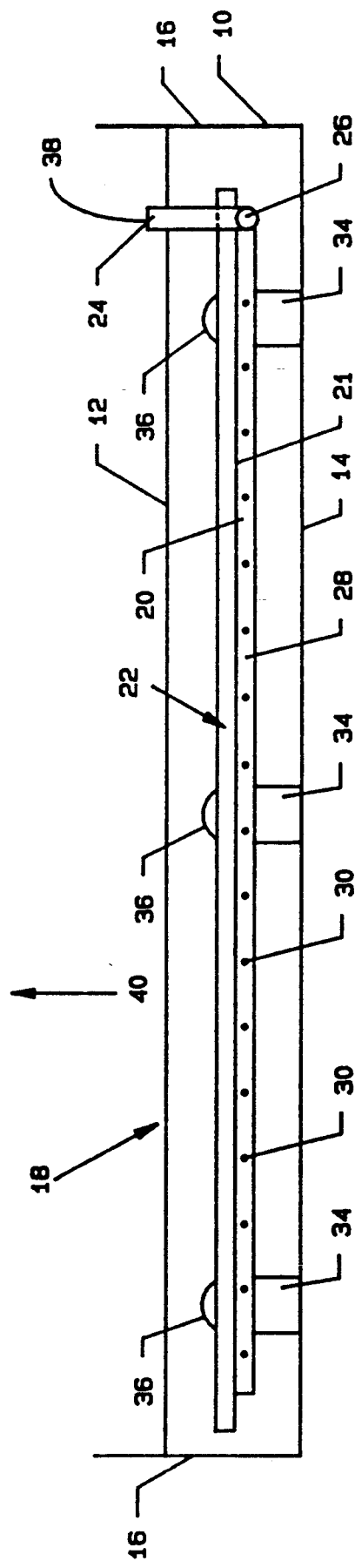
FIG. 1 is a side plan view of an ozone diffusion system according to the present invention shown schematically mounted in a tank; and, FIG. 2 is a top plan view of the distribution plate of the present invention with a distribution manifold shown in phantom.
Figure 2:
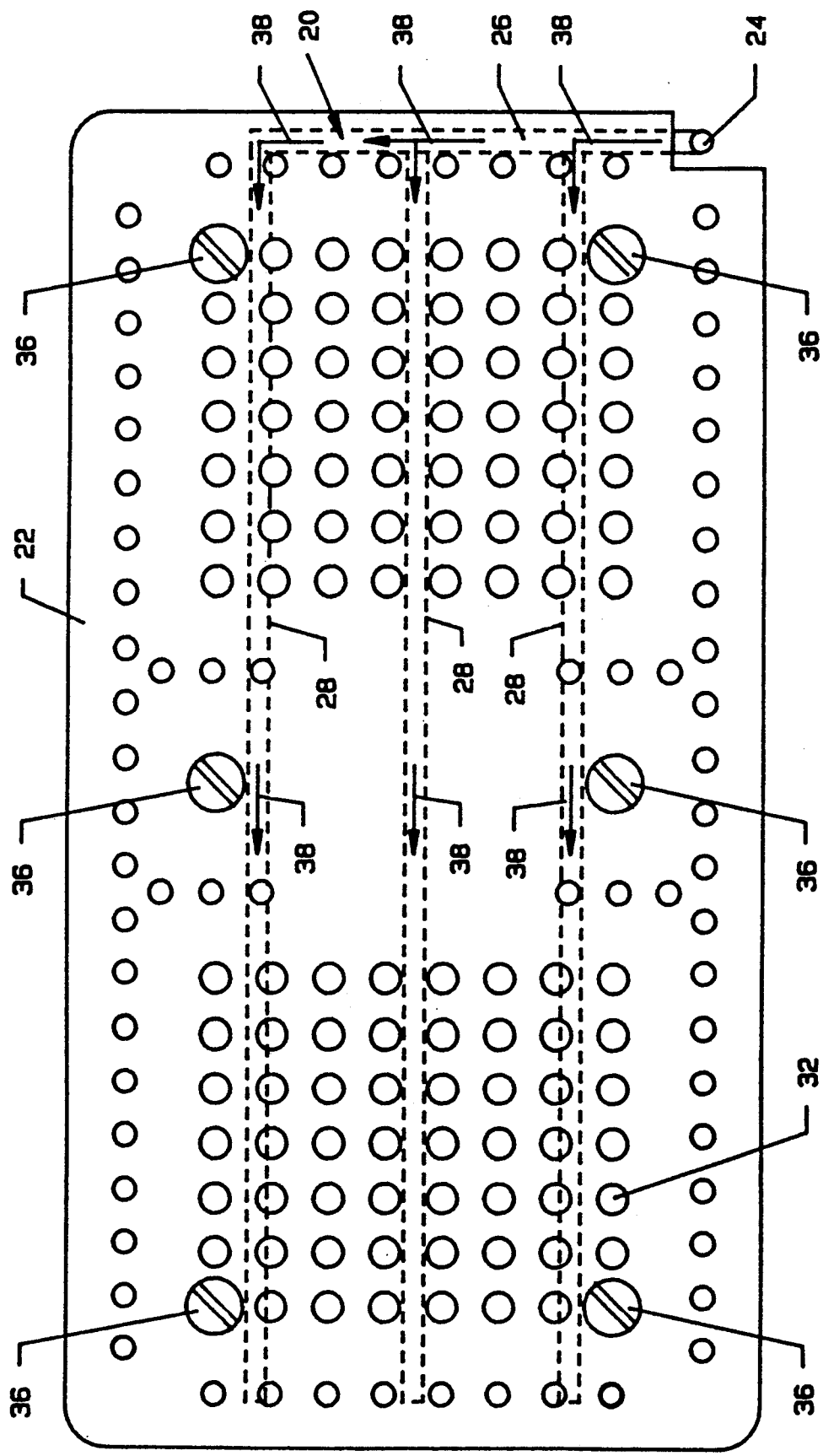

FIG. 1 illustrates a tank 10 containing a liquid 12. In the preferred embodiment, liquid 12 is a sulfuric acid ($H_2SO_4$) bath for cleaning semiconductor wafers. Tank 10 is constructed of material generally inert to the liquid 12. In particular, it has been found that a tank of quartz, PFA or Teflon is resistant to the chemicals in liquid 12. The quartz has material integrity, and can have appropriate surface finish applied to maintain it as inert to the chemicals.

Tank 10 has a bottom 14 and multiple sides 16. Mounted in tank 10, generally adjacent to bottom 14, is a gas diffusion system 18. Structure for diffusing gas includes a manifold system 20 and a diffusion or sparger plate 22.

Manifold system 20 has a generally vertically mounted ozone inlet tube 24. Ozone inlet tube 24 is connected for gas transmission to a horizontally extending distribution tube 26. Mounted to distribution tube 26 are multiple diffusion tubes 28. In the preferred embodiment, tubes 26 and 28 all lie in a plane with tubes 28 mounted generally at a right angle to distribution tube 26. Tubes 28 are distributed throughout the bottom 14 of tank 10 to distribute gas, such as ozone, in a wide variety of locations. In the preferred embodiment, tubes 26 and 28 are quartz cylinders with a ⅜" outside diameter and a ¼" inside diameter.

A set of gas apertures or holes 30 are provided in diffusion tubes 28, preferably on a top side of the tubes 28. These apertures 30 are preferably 0.004" in diameter for use with ozone. Of course, for other gases and other baths, the apertures 30 will be sized appropriately for properly allowing passage of the gas.

In this portion of the structure for gas diffusion system 18, ozone gas is injected through ozone inlet tube 24 by an ozone generator (not illustrated), passes through distribution tube 26, is distributed through the multiple diffusion tubes 28, and is bubbled upwardly through gas apertures 30.

Sparger plate 22 is a quartz plate with a bottom surface 21 and gas passages 32. In this embodiment, the sparger plate 22 is ¼" thick. In the preferred embodiment, gas passages 32 are laser cut circular holes 5 mm in diameter and are distributed in a symmetrical pattern across sparger plate 22. The pattern of gas passages 32 may be selected to form particular distribution flows. In this example, gas passages 32 are in two sets. The gas passages 32 may be evenly distributed. The sparger plate 22 is generally sized to cover most of the bottom 14 of tank 10. For example, in the preferred embodiment, bottom 14 is generally 16"×8". The corresponding sparger plate 22 is generally 15.75"×7.75". The sparger plate 22 is welded to manifold system 20 to provide a rigid, strong unit for mounting in tank 10.

In order to separate the sparger plate 22 and the manifold system 20 from contact with tank 10, the gas diffusion structure 18 is mounted on support pads 34. In the preferred embodiment, six such pads 34 made of Teflon, or other like material, are mounted on the bottom side of sparger plate 22 for contact with bottom 14 of tank 10. These pads or standoffs 34 are mounted to sparger plate 22 by Teflon screws 36 which extend through sparger plate 22 into pads 34. In the illustrated embodiment, pads 34 are approximately ¾" in diameter.

MODE OF OPERATION

In operation, ozone gas enters ozone inlet tube 24 and generally follows the path of arrows 38 as illustrated in FIGS. and 2. Gas bubbles upward through gas apertures 30 and multiple diffusion tubes 28 and then spreads along lower surface 31 of sparger plate 22. Gas then bubbles upward through gas passages 32. Gas then rises in the tank in the direction of arrow 40. Through use of this distribution system, a uniform agitating effect is achieved during gas injection. Ozone is disbursed evenly into the tank and all semiconductor wafers, as well as the sulfuric acid receive an even distribution of ozone. The problems of the prior art and any deficient and uneven distribution of gas within the acid are ameliorated.

By use of the distribution system constructed according to the present invention, defects to the semiconductor wafers due to incorrect oxygenation of a bath are avoided. While the present embodiment is illustrated in view of an acid bath for semiconductor wafers which is oxygenated, the present invention is adaptable by those skilled in the art to any such a bath system requiring gas injection.

We claim:

1. A gas distribution system for a bath tank comprising:
   a. a liquid-containing tank having a bottom and multiple sides;
   b. a gas-conducting pipe mounted generally adjacent to the bottom of the tank having holes for releasing gas; and,
   c. a sparger plate mounted in the tank over the pipe having diffusion holes for distributing gas from the pipe generally evenly throughout the bath in the tank.

2. The gas distribution system of claim 1 wherein the plate is a quartz plate having laser cut gas passages generally distributed throughout the plate.

3. The gas distribution system of claim 3 further comprising cushioning means for mounting the plate in a spaced apart relation from the bottom of the tank for preventing breakage.

4. In an acid bath tank, the type having a gas bubble to the tank from a pipe system, a means for distributing the gas comprising:
   a. diffusion means mounted over the pipe system for evenly distributing gas from the pipes throughout the acid bath.

5. The distribution system of claim 4 wherein diffusion means is a plate made of material inert to the acid having passages through the plate evenly distributed across the plate for bubbling gas in an evenly distributed pattern upward through the acid bath.

6. A distribution system for evenly bubbling a gas through a bath comprising:
   a. a gas manifold including gas-carrying pipes having apertures in an upward side for releasing gas; and,
   b. a diffusion plate mounted over the manifold having a pattern of gas passages for providing uniform up-flow of gas from the manifold upward throughout the bath.

7. The distribution system of claim 6 wherein the bath contains corrosive liquids and the diffusion plate is made of quartz, PFA or Teflon which is resistant to the liquids.

* * * * *